SIGNAL TRANSLATING CIRCUIT EMPLOYING INSULATED-GATE FIELD-EFFECT TRANSISTORS COUPLED THROUGH A COMMON SEMICONDUCTOR SUBSTRATE

Filed Jan. 29, 1964

INVENTOR.
ROBERT S. SILVER
BY Eugene M. Whitacre
Attorney

United States Patent Office 3,246,173

Patented Apr. 12, 1966

3,246,173

SIGNAL TRANSLATING CIRCUIT EMPLOYING INSULATED-GATE FIELD EFFECT TRANSISTORS COUPLED THROUGH A COMMON SEMICONDUCTOR SUBSTRATE

Robert S. Silver, Princeton, N.J., assignor to Radio Corporation of America, a corporation of Delaware Filed Jan. 29, 1964, Ser. No. 340,883
10 Claims. (Cl. 307—88.5)

This invention relates to signal translating circuits employing semiconductor devices and more particularly relates to signal translating circuits wherein various components of the circuit are formed as an integral part of a unitary block of semiconductor material.

It is an object of this invention to provide an improved signal translating circuit wherein the various components of the circuit are formed as an integral part of a unitary block of semiconductor material.

It is another object of this invention to provide an improved signal translating circuit of controllable gain or attenuation, integrated in a unitary block of semiconductor material.

A signal translating circuit embodying the invention comprises first and second field-effect transistors each having source and drain electrodes in a common substrate of semiconductor material and a gate electrode insulated from the substrate. Circuit means respectively connect the gate, source and drain electrodes of the first and second transistors in the common drain and in the common source configurations. Input signals are applied between the gate and source electrodes of the first transistor. The signals applied to the gate electrode of the first transistor are developed across its source resistor and coupled to the substrate through the source-to-substrate capacitance of the first transistor. Since both transistors are formed on the same substrate the signals coupled to the substrate modulate the source-drain current of the second transistor and can be developed in a suitable output circuit connected to the drain electrode of the second transistor. The efficiency of the signal transmission through the circuit may be adjusted by a D.-C. control voltage applied to the gate electrode of the second transistor. When the circuit is used for automatic gain control purposes the control voltage is derived as some function of signal level.

The amount of signal coupled from the source electrode of the first transistor is a function of the physical size of the source region of that transistor. It has been found desirable to design the first transistor with a large source region relative to the other source and drain regions to provide increased source-to-substrate coupling.

The novel features which are considered to be characteristic of this invention are set forth with particularity in the appended claims. The invention itself, however, both as to its organization and method of operation will best be understood from the following description when read in connection with the accompanying drawings in which:

Figure 1:
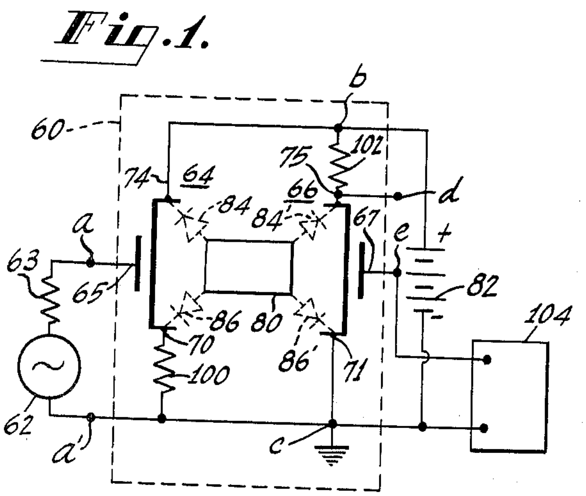
FIGURE 1 is a schematic circuit diagram of a signal translating circuit embodying the invention.

Reference is now made to FIGURE 1 of the drawings which is a schematic circuit diagram of a signal translating circuit 60 embodying the invention.

Figure 3:
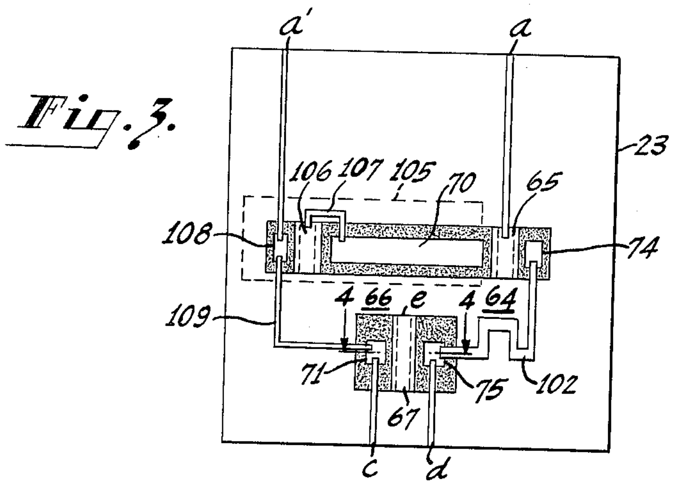
FIGURE 3 is a diagrammatic plan view of the unitary block of semiconductor material embodying the signal translating circuit shown in schematic form in FIGURE 1.
Figure 4:
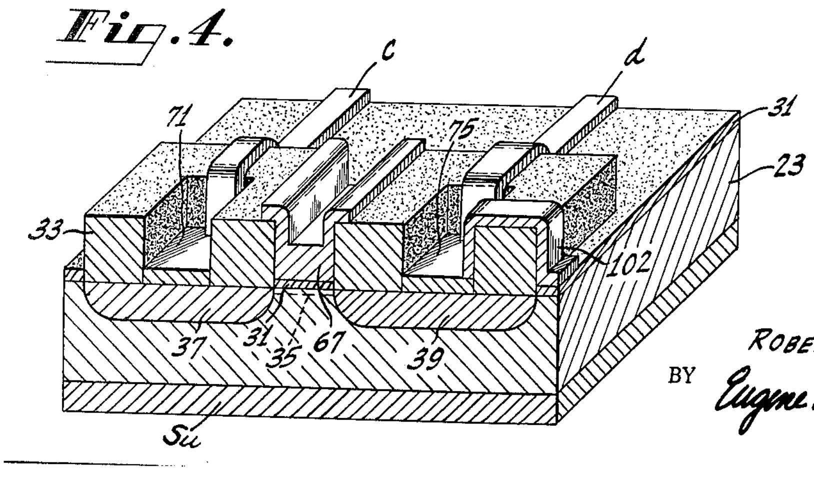
FIGURE 4 is a diagrammatic perspective view, partly in cross section, of the unitary block shown in FIGURE 3; the cross sectional view being taken along line 4—4 in FIGURE 3.

Input signals from a signal source represented as a generator 62 are applied through the generator internal impedance 63 to a pair of input terminals *a* and *a'* of the signal translating circuit 60. An insulated-gate field-effect transistor 64 and an insulated-gate field-effect transistor 66 have their gate, source and drain electrodes 65, 67; 70, 71; and 74, 75 respectively formed on a common substrate of semiconductor material 80 as shown in FIGURES 3 and 4. The field-effect transistor 64 is connected in the common drain configuration between the pair of input terminals *a–a'* and an operating potential terminal *b*. In this particular case the drain electrode is at an alternating-current ground potential.

The field-effect transistor 66 is connected in the common-source configuration between a pair of voltage control terminals *e* and *c* and the operating potential terminal *b*. Output signals are derived from the signal translating circuit 60 between an output terminal *d* connected to the drain electrode 75 and the terminal *c* which is connected to a point of reference potential shown as ground. The terminal *a'* is also grounded.

A source of operating potential, shown as the battery 82 is connected between the terminal *b* and ground; the negative terminal of the battery 82 being grounded.

Each of the transistors 64 and 66 has a pair of rectifying junctions between the substrate 80 and the source and drain electrodes respectively, shown as diodes 84, 84' and 86, 86'. Each of the rectifying junctions (diodes) 84, 84', 86, and 86' may be represented by a network including a resistor and a capacitor in parallel. The capacitance exhibited by each of the rectifying junctions is a function of the dielectric constant $\epsilon$ of the junction, the area A of the junction and the distance *d* between the effective plates of the capacitor (effective width of the space region or depletion layer). By proper design of the source area of the transistor 64, the area of the source-substrate junction 86 is made larger than the corresponding drain-substrate junction area. For example, the capacitance of the rectifying junction 86 may be made large relative to the capacitance exhibited by the other source-substrate and drain-substrate rectifying junctions 84, 86' and 84'.

The source electrode 70 is coupled to ground through a resistor 100. The drain electrode 74 is directly connected to the operating potential terminal *b*, and the drain electrode 75 is connected to the same terminal through a resistor 102. The rectifying junctions 84 and 84', respectively connected between the drain electrodes 74 and 75 and the substrate 80, are reverse biased. The substrate 80 is at slightly positive potential, with respect to ground. The voltage across the rectifying junction 86 is the difference between the voltage across the resistor 100 and the substrate 80 so that the rectifying junction 86 is reverse biased. The voltage at the substrate appears across the rectifying junction 86' and hence forward biases the rectifying junction 86'.

A control voltage source 104 is connected between the gate electrode 67 of the transistor 66 and the terminal *c* (which is grounded) to control the drain-source current flow of transistor 66. The control voltage source may be a fixed D.-C. bias voltage or a variable voltage source such as an automatic gain control voltage source.

In operation, input signals are applied to the transistor 64 between the gate electrode 65 and ground. The transistor 64 is a depletion type transistor, and the zero-bias (gate-to-source voltage) curve in its drain current vs.

drain voltage characteristic corresponds to a drain current within the linear region of the drain voltage vs. drain current characteristic. Enhancement-type transistors i.e., transistors having a zero bias curve that corresponds to cut-off condition, or to negligible drain current flow, may be employed in the circuit shown in FIGURE 1 as long as bias voltages are applied between the gate and source electrodes in the transistors to render the transistors normally conductive in a desired region of its current-voltage characteristic (in its linear portion for class A operation) absent any input signal.

The input signals modulate the current flow through drain-source current path of the transistor 64 producing a signal voltage across the resistor 100. This signal voltage is coupled to the substrate through the low impedance path provided by the capacitance of the rectifying junction 86.

Because the signal voltage applied to the substrate 80 is derived across the resistor 100 and coupled to the substrate 80 through a capacitance voltage divider network including the source-substrate capacitance and the drain-substrate capacitance connected in the order named, by making the source-substrate capacitance large relative to the drain-substrate capacitance improved signal coupling is achieved. The signal coupled to the substrate modulates the current flowing between the source electrode 71 and the drain electrode 75.

As previously mentioned, a control voltage is applied from a control voltage source 104 between the gate electrode 67 and the source electrode 71. This control voltage determines the current flow through the source-drain current path of the transistor 66.

The control voltage applied to the gate electrode 67 controls the magnitude of the effective signal current flow through the drain electrode 75 in such a way that the more positive the voltage on the gate electrode 67, the smaller the signal current flow through the drain electrode 75 although the total drain current flow increases with increasingly positive gate voltages. Also the incremental change in signal drain current per incremental change in substrate signal voltage is reduced as the gate voltage becomes more positive.

Output signals are derived at the output terminal *d* from the drain electrode 75 across the resistor 102. The output signals are coupled to a utilization circuit, not shown, which may be an amplifier stage for example. If the signal translating circuit shown in FIGURE 1 is employed in a signal receiver, such as a radio receiver for example, the control voltage source 104 may comprise the audio detector stage (with appropriate filtering) of the radio receiver which provides a D.-C. voltage as a function of signal strength. The signal translating circuit shown in FIGURE 1 may be connected in cascade in the receiver signal channel to provide the desired automatic gain control for the radio receiver set.

Figure 2:
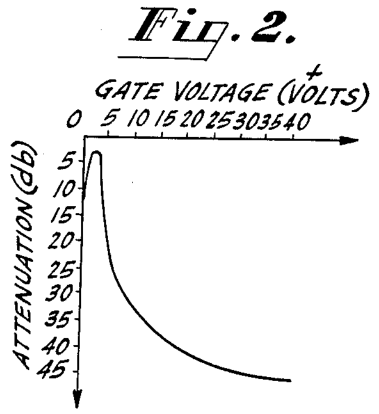
FIGURE 2 is a graph showing the attenuation in decibels vs. the control gate voltage applied to the circuit shown in FIGURE 1.

The automatic gain control (AGC) characteristic provided by a circuit similar to the circuit shown in FIGURE 1 is illustrated in FIGURE 2. The AGC range shown therein is approximately 45 decibels which is a sufficient range for radio receivers for example. The AGC characteristic shown in FIGURE 2 was obtained from a circuit in which both transistors 64 and 66 were of the enhancement type. As previously described, appropriate biasing of enhancement type transistors is necessary for linear operation so that a bias voltage between the gate electrode 65 and ground was provided for the transistor 64.

As shown in FIGURE 2, from a gate voltage of approximately 5 volts to gate voltage of approximately 40 volts, the attenuation characteristic aproximates a smooth exponential characteristic which is the optimum AGC transfer characteristic. It has been found that when bipolar transistors are employed to provide AGC, some distortion is introduced by the sharp curvature of their transfer characteristic. In addition, the typical attenuation range for comparable type bipolar AGC transistor circuits is in the order of 25 decibels per stage.

The gate voltage required to obtain the AGC range shown in FIGURE 2 may be reduced by decreasing the thickness of the oxide layer insulating the gate electrode from the semiconductor substrate. As an example, a reduction of 75% in the thickness of the insulating layer resulted in a gate voltage range of 10 volts (1–10 volts) for an attenuation range similar to the one shown in FIGURE 2.

The circuit shown in FIGURE 1 is built as a unitary block, as shown in FIGURE 3. The translating circuit is built on a single base or body 23 of semiconductor material. The base 23 may be either a single crystal or polycrystalline and may be of any one of the semiconductor materials used to prepare transistors in the semiconductor art. The same letters indicating the terminals of the circuit shown in FIGURE 1 are shown in FIGURE 3 to designate similar terminals. The numerals employed in the circuit shown in FIGURE 1 are also employed in FIGURE 3 to designate the elements common to both FIGURES 1 and 3. The resistor 100 shown in FIGURE 1 is replaced by an insulated-gate field-effect transistor 105 which operates as a linear resistor (shown encompassed by a dashed rectangle). The drain electrode of transistor 105 also serves as the source electrode 70 of the transistor 64. The gate electrode 106 is connected to the drain electrode 70 by an evaporated metallic contact 107 (evaporated at the same time that the other metallic electrodes and connections are formed).

The source electrode 108 is connected to the input terminal *a'*, which is the ground terminal. Another metallic contact 109 connects the source electrode 108 to the source electrode 71 of transistor 66.

The resistor 102 is an evaporated film resistor having the desired value of resistance. A transistor similar to the transistor 105 and having its gate and source electrodes interconnected in a manner similar to that shown for the transistor 105 may be substituted for the resistor 102.

To obtain good coupling of the input signal through the source-substrate capacitance the transistor 66 should be in close proximity to the source electrode 70.

FIGURE 4 of the drawings which is a diagrammatic perspective view taken in cross section along a line 4—4 in FIGURE 3 is helpful for describing the manufacturing process of the integrated circuit shown in FIGURE 1. As shown in FIGURE 4, the transistor 66 includes a gate electrode 67 and a pair of electrodes 71 and 75 which are used as the source and drain electrodes. The gate electrode is separated from the body of the semiconductor material by an insulating oxide layer 31.

The transistors 64, 66 and 105 are simultaneously prepared by the following process. However, for reasons of simplicity of illustration the process will be described using transistor 66 alone. The body 23 is lightly doped P-type silicon of relatively high resistivity, such as 10 ohm cm. The body 23 has at least one surface cleaned to expose the body material. This may be achieved, for example, by etching the surface of the body with a chemical etchant to remove all of the disturbed material on the surface. Heavily doped silicon dioxide is then deposited by any suitable means as a layer portion 33 on selected areas of the clean surface of the body 23. For example, a uniform layer of doped silicon dioxide may be deposited on the crystal body 23 and the portion of the deposited layer overlying the location where the insulating layer 31 is to be formed is removed. The deposited oxide may be removed in any suitable manner such as by a photo resist and acid etching technique. The thickness of the deposited oxide layer 33 is preferably between one and five microns. As previously mentioned, the deposited oxide is removed also on the regions overlying the location where insulating layers for the gate electrodes of the transistors 64 and 105 are to be formed.

The deposited silicon dioxide layer 33 contains a relatively high concentration of impurities (also referred to as dopant) which are N-type when present in silicon. Such impurities may for example be antimony, arsenic, or phosphorus.

The body 23 is then placed in a furnace and heated to about 900 to 1100° C. in a dry oxygen atmosphere and cooled. During the heating, the exposed surface portion of the silicon body 23 (under the later-applied gate electrode 67) is converted to silicon dioxide. Such converted material is referred to as thermally grown silicon dioxide and comprises the oxide layer 31 as shown in the drawings. The converted material 31 is essentially pure silicon dioxide and has a high resistivity on the order of $10^{14}$ ohm=cm. A conducting channel 55 forms at the interface between the oxide layer 31 and silicon body 23 when the appropriate voltages (potentials) are applied to the device electrodes. During the same heating step, impurities from the deposited silicon dioxide layer 33 diffuse into the silicon as indicated at 37 and 39. The regions 37 and 39 are of low resistivity and provide a low resistance connection to the conducting channel 35.

Portions of the deposited oxide layer 33 are then removed to permit access to the diffused regions 37 and 39. Conductive electrodes are then selectively deposited on the diffused regions 37 and 39 to form the source and drain electrodes 71 and 75, and on the insulating layer 31 to form the gate electrode 67. The gate electrode 67 may be coextensive with the layer 31 of grown silicon dioxide, or may overlie only a portion of the conducting channel 35. If desired, the gate may be displaced laterally to a position closer to one of the source and drain regions 37 and 39.

In the transistor described, the length of the channel 35 is about 0.0005 inch; that is the distance between the diffused areas 37 and 39, and the width of the channel is about 0.05 inch. The high resistivity layer 31 of silicon dioxide is about 2700 Angstroms thick. Such a transistor has an input resistance about $10^{14}$ ohms, as measured between source and gate electrodes.

A feature of an insulated-gate field-effect transistor is that the zero bias curve of its drain current vs. drain voltage characteristic can be at any value of drain current. The curves above the zero bias curve representing positive bias voltage relative to the source and the curves below the zero bias curve representing negative gate voltages relative to the source. The location of the zero bias curve may be selected by the control of the processing of the transistor during the manufacture. For example, by controlling the time and/or temperature of the step of the process when the silicon dioxide layer 31 is grown, the number of free charge carriers in the device can be controlled. The longer the transistor is baked, and the higher the temperature, in a dry oxygen atmosphere, the more the drain current for a given amout of drain voltage for zero bias between the source and gate electrodes.

As previously explained both transistors 64 and 66 may be either enhancement or depletion type transistors, or if preferred one may be an enhancement type transistor and the other a depletion type transistor.

The method of manufacturing the circuit shown in FIGURE 3 when the transistor 64 is a depletion type and the transistor 66 is an enhancement type is as follows:

After the silicon dioxide layer 33 is deposited over the selected areas of the body 23 as previously explained, the silicon dioxide is removed over the area where the channel of the transistor 66 is to be formed. The unitary circuit block is then baked for a suitable length of time, approximately five minutes, so that the impurities in the silicon dioxide layer 33 may diffuse forming a thin uniform N-type layer under the region where the transistor 64 is to be formed. Simultaneously the drain and source regions of the transistor 66 begin to be formed.

The silicon dioxide is then removed over the area where the channel of the transistor 64 is to be formed. The unitary circuit block is then baked as previously described to (1) complete the formation of the source and drain regions of the transistor 64 and (2) form the source and drain regions of the transistor 66.

The source electrode 70 may be built in a manner such that it would partly enclose the transistor 66. It has been found that by partly enclosing the transistor 66 by the source electrode 70, in close proximity, better signal coupling through the source-substrate capacitance from the source region of transistor 64 to the source-drain current path of transistor 66 is obtained.

What is claimed is:

1. A signal translating circuit comprising in combination:
first and second insulated-gate field-effect transistors each having source and drain electrodes formed in a common semi-conductor substrate wherein rectifying junctions are formed between said substrate and said source and drain electrodes;
circuit means coupled to said gate, source and drain electrodes of said first and second transistors for connecting said first and second transistors as signal translating devices;
a first pair of terminals coupled to said first transistor for applying input signals to said signal translating circuit:
a second pair of terminals coupled to said second transistor for deriving output signals from said signal translating circuit; and
a bias terminal coupled to said gate electrode of said second transistor for applying a voltage between said gate and source electrodes of said second transistor to control the current flow through said drain-source current path.

2. A signal translating circuit comprising in combination:
first and second insulated-gate field-effect transistors each having source and drain electrodes formed in a common semi-conductor substrate wherein rectifying junctions are formed between said substrate and said source and drain electrodes;
circuit means coupled to said electrodes of said first and second transistors for connecting said first and second transistors in a common-drain configuration and in a common-source configuration respectively;
input circuit means coupled to said gate electrode for coupling input signals to said first transistor;
circuit means coupled to said gate electrode of said second transistor for coupling a voltage to control the current flow through the source-drain current path of said second transistor as a function of input signal strength; and
circuit means coupled to said drain electrode of said second transistor for deriving output signals.

3. A signal translating circuit comprising in combination:
first and second insulated-gate field-effect transistors each having source and drain electrodes formed in a common semiconductor substrate wherein rectifying junctions are formed between said substrate and said source and drain electrodes; said rectifying junctions exhibiting capacitance between said substrate and said drain and source electrodes respectively, said capacitance exhibited by said source-substrate rectifying junction of said first transistor being large relative to said drain-substrate capacitance of said first transistor;
circuit means coupled to said gate, source and drain electrodes of said first and second transistors for connecting said first and second transistors as signal translating devices;
input circuit means coupled to said gate electrode of said first transistor for applying input signals to said first transistor, said input signals being coupled to said second transistor only through said common substrate;

bias circuit means coupled to said gate electrode of said second transistor for controlling the source-drain current flow of said second transistor; and circuit means coupled to said drain electrode of said second transistor for deriving output signals.

4. A signal translating circuit comprising in combination:

first and second insulated-gate field-effect transistors each having source and drain electrodes formed in a common semiconductor substrate wherein rectifying junctions are formed between said substrate and said source and drain electrodes, said rectifying junctions exhibiting capacitance respectively connected between said substrate and said drain and drain and source electrodes, said capacitance exhibited by said source-substrate rectifying junction of said first transistor being large relative to said drain-substrate capacitance of said first transistor, circuit means including a resistor coupled between said source and drain electrodes of said first transistor;

circuit means coupled between said gate and source electrodes of said first transistor for applying input signals to said first transistor, said input signals being coupled to said common substrate through said source-substrate capacitance;

bias circuit means coupled to said gate electrode of said second transistor for controlling the source-drain current flow of said second transistor; and circuit means coupled to said drain electrode of said second transistor for deriving output signals.

5. A signal translating circuit formed on a single wafer of semiconductor material comprising in combination:

first, second and third field-effect transistors each having source and drain electrode regions formed in said wafer of semiconductor material, said regions having a gap therebetween, an electrode on each of said drain and source electrode regions, an insulating layer on said semiconductor wafer over said gap, and an electrode on said insulating layer over said gap, said drain electrode of said first transistor and said source electrode of said second transistor constituting a common electrode for said first and second transistors;

input circuit means coupled between said gate electrode of said second transistor and said source electrode of said first transistor for applying input signals;

means coupling said gate electrode of said first transistor to said common electrode so that said first transistor operates as the source resistor of said second transistor;

resistive circuit means formed on said wafer of semiconductor material coupled between the drain electrodes of said second and third transistors respectiively;

circuit means for applying a bias voltage between said gate and source electrodes of said third transistor;

circuit means coupled between the drain and source electrodes of said third transistor for applying an operating potential to said signal translating circuit; and means coupled to said drain electrode of said third transistor for deriving an output signal.

6. A signal translating circuit formed on a single wafer of semiconductor material comprising in combination:

first, second and third field-effect transistors each having source and drain electrode regions formed in said wafer of semiconductor material, said regions a gap therebetween, an electrode on each of said drain and source electrode regions, an insulating layer on said semiconductor wafer over said gap and an electrode on said insulating layer over said gap, said drain electrode of said first transistor and said source electrode of said second transistor constituting a common electrode for said first and second transistors;

input circuit means coupled between said gate electrode of said second transistor and said source electrode of said first transistor for applying input signals;

means coupling said gate electrode of said first transistor to said common electrode so that said first transistor operates as the source resistor of said second transistor;

resistive circuit means formed on said wafer of semiconductor material coupled between the drain electrodes of said second and third transistors respectively.

circuit means for applying a bias voltage between said gate and source electrodes of said third transistor, said bias voltage having a value that is a function of the amplitude of said input signal;

circuit means coupled between the drain and source electrodes of said third transistor for applying an operating potential to said signal translating circuit; and means coupled to said drain electrode of said third transistor for deriving an output signal.

7. An amplifier circuit formed on a single wafer of semiconductor material comprising in combination:

first and second field-effect transistors each having source and drain electrode regions formed in said wafer of semiconductor material, said regions having a gap therebetween, an electrode on each of said drain and source electrode regions, an insulating layer on said semiconductor wafer over said gap, and an electrode on said insulating layer over said gap;

resistive circuit means connected between the source electrodes of said first and second transistors;

input circuit means coupled between the gate and source electrodes of said first transistor;

resistive circuit means formed on said wafer of semiconductor material coupled between the drain of said first and second transistors;

circuit means for applying a bias voltage between said gate and source electrodes of said second transistor;

circuit means for applying an operating potential, coupled between the drain and source electrodes of said second transistor; and means coupled to said drain electrode of said second transistor for deriving an output signal.

8. An integrated circuit element comprising:

first and second insulated-gate field-effect transistors each having source and drain electrodes formed in a common semi-conductor substrate wherein rectifying junctions are formed between said substrate and said source and drain electrodes respectively;

circuit means connecting said first and second transistors as signal translating devices;

an input terminal for connection to a source of signals;

means coupling said input terminal to said first transistor;

an output terminal for connection to a signal utilization circuit; and means coupling said output terminal to said second transistor;

the sole coupling means between said first and second transistors being through said common substrate.

9. An integrated circuit element comprising:

first and second field-effect transistors each having input, output and common electrodes, said output and common electrodes of said first and second transistors being formed in a common semiconductor substrate wherein rectifying junctions are formed between said substrate and said common and output electrodes respectively; said input electrode being insulated from said substrate;

circuit means connecting said first and second transistors as signal translating devices;

a pair of input terminals for connection to a source of signals;
means coupling said input terminals to said input and common electrodes of said first transistor;
a pair of output terminals for connection to a signal utilization circuit; and
means coupling said output terminals to said output and common electrodes of said second transistor;
the sole coupling means between said first and second transistors being through said common substrate.

10. An integrated circuit element comprising:
first and second insulated-gate field-effect transistors each having source and drain electrodes formed in a common semiconductor substrate wherein rectifying junctions are formed in said substrate on said source and drain electrodes;
circuit means connecting said first and second transistors as signal translating devices;

an input terminal for connection to a source of signals;
means coupling said input terminal to said first transistor;
an output terminal for connection with signal utilization circuit;
means coupling said output terminal to said second transistor;
a control terminal for connection to a source of control voltage; and
means coupling said control terminal to said gate electrode of said second transistor;
the sole coupling means between said first and second transistors being through said common substrate.

No references cited.

ARTHUR GAUSS, *Primary Examiner.*

I. C. EDELL, *Assistant Examiner.*